(12) United States Patent
Yang et al.

(10) Patent No.: US 12,713,678 B2
(45) Date of Patent: Aug. 18, 2026

(54) POWER METAL-OXIDE-SEMICONDUCTOR STRUCTURE AND MANUFACTURING METHOD THEREOF

(71) Applicant: UNITED MICROELECTRONICS CORP., Hsin-Chu City (TW)

(72) Inventors: Cheng-Hua Yang, New Taipei City (TW); Chih-Chien Chang, Hsinchu City (TW); Shen-De Wang, Hsinchu County (TW); Jianjun Yang, Singapore (SG); Wei Ta, Singapore (SG); Yuan-Hsiang Chang, Hsinchu City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 503 days.

(21) Appl. No.: 18/138,728

(22) Filed: Apr. 24, 2023

(65) Prior Publication Data

US 2024/0321973 A1 Sep. 26, 2024

(30) Foreign Application Priority Data

Mar. 22, 2023 (TW) ................................ 112110652

(51) Int. Cl.
*H10D 64/00* (2025.01)
*H10B 41/35* (2023.01)
(Continued)

(52) U.S. Cl.
CPC ........... *H10D 64/112* (2025.01); *H10B 41/35* (2023.02); *H10D 30/0281* (2025.01);
(Continued)

(58) Field of Classification Search
CPC .. H10D 64/112; H10D 30/0411; H10D 64/01; H10D 30/603;
(Continued)

(56) References Cited

U.S. PATENT DOCUMENTS

2020/0335623 A1* 10/2020 Shin ..................... H10D 62/153
2024/0250168 A1* 7/2024 Kim ..................... H10D 64/111

FOREIGN PATENT DOCUMENTS

CN 114388616 A * 4/2022 ......... H10D 30/0281
EP 3916802 A1 * 12/2021 ......... H10D 30/0281

* cited by examiner

*Primary Examiner* — Shahed Ahmed
(74) *Attorney, Agent, or Firm* — Winston Hsu

(57) ABSTRACT

A power metal-oxide-semiconductor structure includes a semiconductor substrate, a gate electrode disposed above the semiconductor substrate, a field plate, and an electrically conductive pattern. The gate electrode and the field plate are disposed above the semiconductor substrate, the electrically conductive pattern is disposed between the field plate and the semiconductor substrate in a vertical direction, and the field plate and the electrically conductive pattern are located at the same side of the gate electrode in a horizontal direction. A manufacturing method of a power metal-oxide-semiconductor structure includes the following steps. The electrically conductive pattern and the field plate are formed above a first region of the semiconductor substrate. Subsequently, the gate electrode is formed above the first region of the semiconductor substrate.

13 Claims, 11 Drawing Sheets

(51) Int. Cl.
*H10D 30/01* (2025.01)
*H10D 30/65* (2025.01)
*H10D 64/01* (2025.01)

(52) U.S. Cl.
CPC ......... *H10D 30/0411* (2025.01); *H10D 30/65* (2025.01); *H10D 64/01* (2025.01)

(58) Field of Classification Search
CPC ........ H10D 30/0281–0289; H10D 30/65–659; H10D 64/111–117; H10D 30/68–689; H10B 41/35
See application file for complete search history.

POWER METAL-OXIDE-SEMICONDUCTOR STRUCTURE AND MANUFACTURING METHOD THEREOF

BACKGROUND OF THE INVENTION

1. Field of the Invention

The present invention relates to a power metal-oxide-semiconductor structure and a manufacturing method thereof, and more particularly, to a power metal-oxide-semiconductor structure including a field plate and a manufacturing method thereof.

2. Description of the Prior Art

Double-diffused metal-oxide-semiconductor (DMOS) transistor devices have drawn much attention in power devices having high voltage capability. The conventional DMOS transistor devices are categorized into vertical double-diffused MOS (VDMOS) transistor device and lateral double-diffused MOS (LDMOS) transistor device. Having advantage of higher operational bandwidth, higher operational efficiency, and convenience to be integrated with other integrated circuit due to its planar structure, LDMOS transistor devices are prevalently used in high operation voltage environment such as CPU power supply, power management system, AC/DC converter, and high-power or high frequency band power amplifier. The essential feature of LDMOS transistor device is a lateral-diffused drift region with low doping concentration and large area. The drift region is used to alleviate the high voltage between the drain and the source, and therefore LDMOS transistor device can have higher breakdown voltage. However, as the requirements of related products become higher and higher, how to improve the electrical performance of the power device and/or reduce the area occupied by the power device through design modifications in structure and/or process is still a continuous issue for those in the relevant fields.

SUMMARY OF THE INVENTION

A power metal-oxide-semiconductor (power MOS) structure and a manufacturing method thereof are provided in the present invention. An electrically conductive pattern and a field plate are disposed and stacked at the same side of a gate electrode for improving the electrical performance of the power metal-oxide-semiconductor structure and/or process integration.

According to an embodiment of the present invention, a power metal-oxide-semiconductor structure is provided. The power metal-oxide-semiconductor structure includes a semiconductor substrate, a gate electrode, a field plate, and an electrically conductive pattern. The gate electrode and the field plate are disposed above the semiconductor substrate. The electrically conductive pattern is disposed between the field plate and the semiconductor substrate in a vertical direction. The field plate and the electrically conductive pattern are located at the same side of the gate electrode in a horizontal direction.

According to an embodiment of the present invention, a manufacturing method of a power metal-oxide-semiconductor structure is provided. The manufacturing method includes the following steps. A first electrically conductive pattern and a first field plate are formed above a first region of a semiconductor substrate. The first electrically conductive pattern is located between the first field plate and the semiconductor substrate in a vertical direction. Subsequently, a first gate electrode is formed above the first region of the semiconductor substrate. The first field plate and the first electrically conductive pattern are located at the same side of the first gate electrode in a horizontal direction.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-5 are schematic drawings illustrating a manufacturing method of a power metal-oxide-semiconductor structure according to an embodiment of the present invention, wherein FIG. 3 is a schematic drawing in a step subsequent to FIG. 2, FIG. 4 is a schematic drawing in a step subsequent to FIG. 3, and FIG. 5 is a schematic drawing in a step subsequent to FIG. 4.

FIGS. 6-10 are schematic drawings illustrating a manufacturing method of a memory structure according to an embodiment of the present invention, wherein FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, and FIG. 10 is a schematic drawing in a step subsequent to FIG. 9.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms “on,” “above,” and “over” used herein should be interpreted in the broadest manner such that “on” not only means “directly on” something but also includes the meaning of “on” something with an intermediate feature or a layer therebetween, and that “above” or “over” not only means the meaning of “above” or “over” something but can also include the meaning it is “above” or “over” something with no intermediate feature or layer therebetween (i.e., directly on something).

The ordinal numbers, such as “first”, “second”, etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "etch" is used herein to describe the process of patterning a material layer so that at least a portion of the material layer after etching is retained. When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
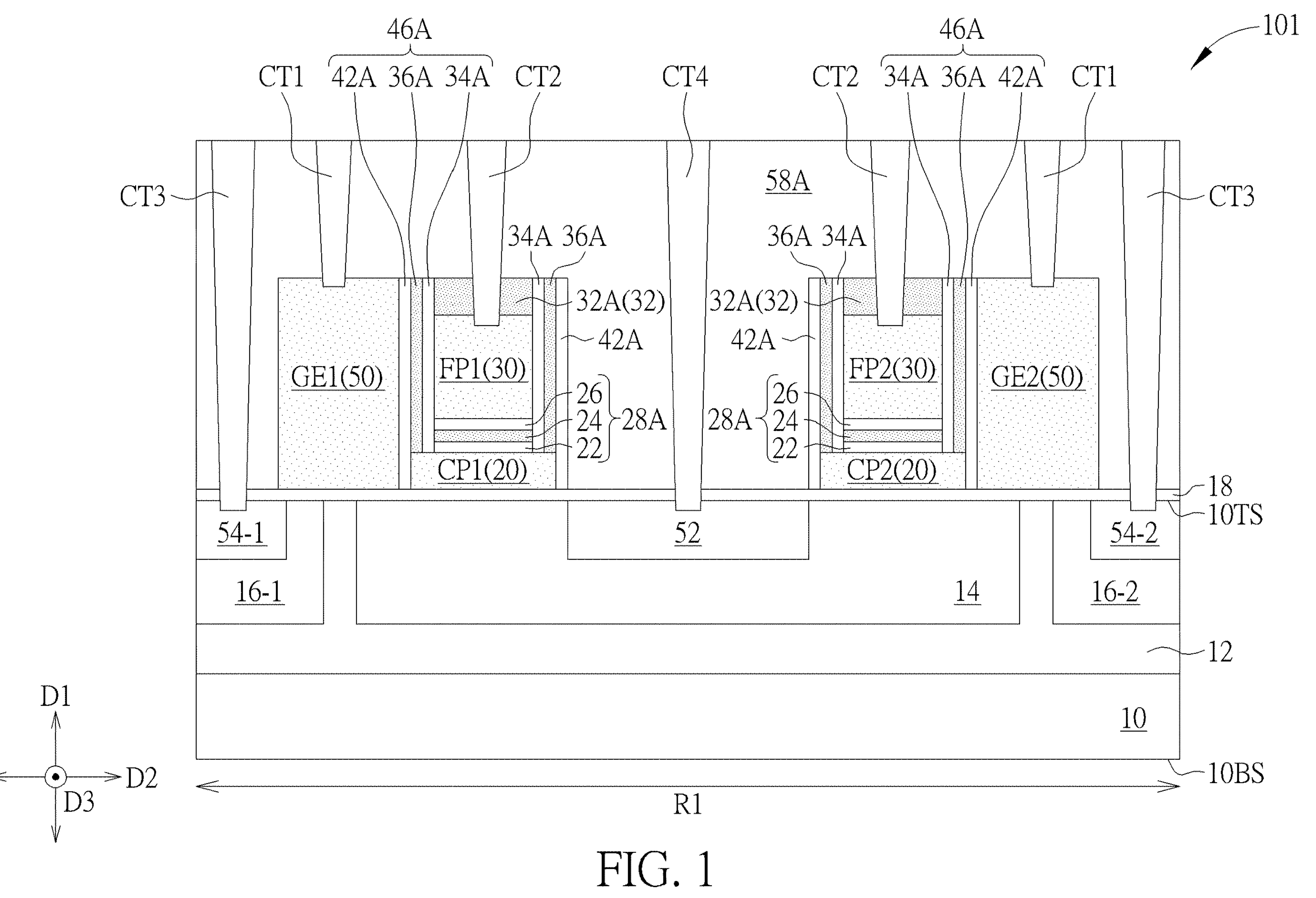
FIG. 1 is a schematic drawing illustrating a power metal-oxide-semiconductor structure according to a first embodiment of the present invention.

Please refer to FIG. 1. FIG. 1 is a schematic drawing illustrating a power metal-oxide-semiconductor (power MOS) structure 101 according to a first embodiment of the present invention. As shown in FIG. 1, the power metal-oxide-semiconductor structure 101 includes a semiconductor substrate 10, a gate electrode GE1, a field plate FP1, and an electrically conductive pattern CP1. The gate electrode GE1 and the field plate FP1 are disposed above the semiconductor substrate 10. The electrically conductive pattern CP1 is disposed between the field plate FP1 and the semiconductor substrate 10 in a vertical direction D1. The field plate FP1 and the electrically conductive pattern CP1 are located at the same side of the gate electrode GE1 in a horizontal direction D2. By disposing the field plate FP1 and the electrically conductive pattern CP1 at the same side of the gate electrode GE1 and disposing the electrically conductive pattern CP1 between the field plate FP1 and the semiconductor substrate 10, the electrical performance of the power metal-oxide-semiconductor structure 101 may be improved. For example, the breakdown voltage of the power metal-oxide-semiconductor structure 101 may be increased and/or the on-resistance (Ron) of the power metal-oxide-semiconductor structure 101 may be reduced accordingly, but no limited thereto.

In some embodiments, the vertical direction D1 described above may be regarded as a thickness direction of the semiconductor substrate 10. The semiconductor substrate 10 may have a top surface 10TS and a bottom surface 10BS opposite to the top surface 10TS in the vertical direction D1, and the gate electrode GE1, the electrically conductive pattern CP1, and the field plate FP1 described above may be disposed on the side of the top surface 10TS of the semiconductor substrate 10. Horizontal directions substantially orthogonal to the vertical direction D1 (such as the horizontal direction D2, a horizontal direction D3, and other directions orthogonal to the vertical direction D1) may be substantially parallel with the top surface 10TS and/or the bottom surface 10BS of the semiconductor substrate 10, but not limited thereto. In this description, a distance between the bottom surface 10BS of the semiconductor substrate 10 and a relatively higher location and/or a relatively higher part in the vertical direction D1 is greater than a distance between the bottom surface 10BS of the semiconductor substrate 10 and a relatively lower location and/or a relatively lower part in the vertical direction D1. The bottom or lower portion of each component may be closer to the bottom surface 10BS of the semiconductor substrate 10 in the vertical direction D1 than the top or upper portion of this component. Another component disposed above a specific component may be regarded as being relatively far from the bottom surface 10BS of the semiconductor substrate 10 in the vertical direction D1, and another component disposed under a specific component may be regarded as being relatively closer to the bottom surface 10BS of the semiconductor substrate 10 in the vertical direction D1. Additionally, in this description, a top surface of a specific component may include the topmost surface of this component in the vertical direction D1, and a bottom surface of a specific component may include the bottommost surface of this component in the vertical direction D1, but not limited thereto. Additionally, in this description, the condition that a certain component is disposed between two other components in a specific direction may include a condition that the certain component is sandwiched between the two other components in the specific direction, but not limited thereto.

In some embodiments, the semiconductor substrate 10 may include a silicon substrate, an epitaxial silicon substrate, a silicon germanium substrate, a silicon carbide substrate, a silicon-on-insulator (SOI) substrate, or a semiconductor substrate made of other suitable semiconductor materials and/or having other suitable structures. In some embodiments, a topmost surface of the electrically conductive pattern CP1 may be lower than a topmost surface of the gate electrode GE1 in the vertical direction D1, and a topmost surface of the field plate FP1 may be lower than the topmost surface of the gate electrode GE1 in the vertical direction D1. The electrically conductive pattern CP1, the field plate FP1, and the gate electrode GE1 may respectively include a non-metallic electrically conductive material (such as doped polysilicon) or other suitable electrically conductive materials, and the electrically conductive pattern CP1 may be an electrically floating pattern electrically separated from the field plate FP1 and the gate structure electrode GE1, but not limited thereto. As shown in FIG. 1, in some embodiments, the power metal-oxide-semiconductor structure 101 may further include a drain doped region 52, a source doped region 54-1, and a dielectric layer 18. The drain doped region 52 may be disposed in the semiconductor substrate 10, and the electrically conductive pattern CP1 may be located between the drain doped region 52 and the gate electrode GE1 in the horizontal direction D2. The source doped region 54-1 may be disposed in the semiconductor substrate 10, and at least a portion of the gate electrode GE1 may be located between the electrically conductive pattern CP1 and the source doped region 54-1 in the horizontal direction D2. In other words, the source doped region 54-1 and the drain doped region 52 may be located at two opposite sides of the gate electrode GE1 in the horizontal direction D2, respectively, and the field plate FP1 and the electrically conductive pattern CP1 may be located between the drain doped region 52 and the gate electrode GE1 in the horizontal direction D2. The dielectric layer 18 may be disposed on the semiconductor substrate 10, a portion of the dielectric layer 18 may be sandwiched between the electrically conductive pattern CP1 and the semiconductor substrate 10 in the vertical direction D1, and another portion of the dielectric layer 18 may be sandwiched between the gate electrode GE1 and the semiconductor substrate 10 in the vertical direction D1. The dielectric layer 18 may include an oxide dielectric material (such as silicon oxide) or other suitable dielectric materials.

In some embodiments, the power metal-oxide-semiconductor structure 101 may further include a well region 12, a drift region 14, and a well region 16-1. The well region 12, the drift region 14, and the well region 16-1 may be disposed in the semiconductor substrate 10, and at least a portion of the well region 12 may be located under the drift region 14 and located under the well region 16-1 in the vertical direction D1. The drain doped region 52 may be located in the drift region 14, and the source doped region 54-1 may be located in the well region 16-1. In some embodiments, the conductivity type of the drift region 14 may be complementary to the conductivity type of the well region 12 and the conductivity type of the well region 16-1, the conductivity type of the drain doped region 52 may be identical to that of the drift region 14, and the conductivity type of the source doped region 54-1 may be complementary to the conductivity type of the well region 16-1, but not limited thereto. For example, the well region 12 may be a p-type deep well region, the well region 16-1 may be a p-type well region, the drift region 14 may be an n-type doped region, and the drain doped region 52 and the source doped region 54-1 may be n-type heavily doped regions, but not limited thereto. Additionally, in some embodiments, at least a part of the electrically conductive pattern CP1, at least a part of the field plate FP1, and at least a part of the gate electrode GE1 may be located above the drift region 14 in the vertical direction D1, and a portion of the well region 16-1 may be located under the gate electrode GE1 in the vertical direction D1, but not limited thereto.

In some embodiments, the power metal-oxide-semiconductor structure 101 may further include a dielectric structure 28A, a dielectric structure 46A, and mask pattern 32A. The mask pattern 32A may be disposed on the field plate FP1, and the dielectric structure 28A may be disposed between the field plate FP1 and the electrically conductive pattern CP1 in the vertical direction D1. The dielectric structure 46A may be disposed above the semiconductor substrate 10, and the dielectric structure 46A may be disposed on a sidewall of the mask pattern 32A, a sidewall of the field plate FP1, and a sidewall of the electrically conductive pattern CP1. In addition, the dielectric structure 46A may be partly disposed between the field pate FP1 and the gate electrode GE1 in the horizontal direction D2 and partly disposed between the electrically conductive pattern CP1 and the gate electrode GE1 in the horizontal direction D2. In some embodiments, the dielectric structure 28A and the dielectric structure 46A may be dielectric structures composed of a single layer of a dielectric material or multiple layers of dielectric materials, and the dielectric material may include oxide (such as silicon oxide, but not limited thereto), nitride (such as silicon nitride, but not limited thereto), oxynitride, carbonitride, or other suitable dielectric materials. The mask pattern 32A may include nitride or other suitable insulating materials.

In some embodiments, the dielectric structure 28A may include a dielectric layer 22, a dielectric layer 24, and a dielectric layer 26 sequentially disposed and stacked from an end of the dielectric structure 28A adjacent to the electrically conductive pattern CP1 towards an end of the dielectric structure 28A adjacent to the field plate FP1 in the vertical direction D1, and the dielectric structure 46A may include a spacer 34A, a spacer 36A, and a spacer 42A sequentially disposed and stacked from an end of the dielectric structure 46A adjacent to the field plate FP1 towards another end of the dielectric structure 46A away from to the field plate FP1 in the horizontal direction D2, but not limited thereto. In some embodiments, the dielectric layer 22, the dielectric layer 24, and the dielectric layer 26 may be oxide, nitride, and oxide, respectively, and the dielectric structure 28A may be regarded as an oxide-nitride-oxide (ONO) structure accordingly, but not limited thereto. In some embodiments, the spacer 34A, the spacer 36A, and the spacer 42A may be oxide, nitride, and oxide, respectively, and the dielectric structure 46A may be regarded as an oxide-nitride-oxide (ONO) structure accordingly, but not limited thereto. In some embodiments, the dielectric structure 28A may directly contact the field plate FP1 and the electrically conductive pattern CP1. For example, the dielectric layer 22 may directly contact the electrically conductive pattern CP1, and the dielectric layer 26 may directly contact the field plate FP1, but not limited thereto. In addition, the dielectric structure 46A may directly contact the field plate FP1 and the gate electrode GE1. For example, the spacer 34A may directly contact the field plate FP1, and the spacer 42A may directly contact the gate electrode GE1, but not limited thereto. In some embodiments, a part of the dielectric structure 46A may be located above the electrically conductive pattern CP1 in the vertical direction D1, a part of the spacer 42A may be sandwiched between the gate electrode GE1 and the electrically conductive pattern CP1, and the spacer 34A may be directly connected with the dielectric structure 28A, but not limited thereto. In some embodiments, the dielectric structure 46A may directly contact the field plate FP1 and the gate electrode GE1, and a part of the dielectric structure 46A may be located directly above the electrically conductive pattern CP1 in the vertical direction D1.

In some embodiments, the gate electrode GE1, the field plate FP1, the electrically conductive pattern CP1, the dielectric layer 18, the dielectric structure 28A, the dielectric structure 46A, the drift region 14, the well region 16-1, the drain doped region 52, and the source doped region 54-1 may constitute at least a portion of a power metal-oxide-semiconductor unit, and the power metal-oxide-semiconductor unit may include a lateral double-diffused MOS (LDMOS) transistor or other types of semiconductor units. The field plate FP1 and the electrically conductive pattern CP1 and the dielectric material (such as the dielectric structure 28A) disposed between the field plate FP1 and the semiconductor substrate 10 may be used to adjust the electric field distribution between the gate electrode GE1 and the drain doped region 52, and the operation performance of the power metal-oxide-semiconductor structure 101 may be improved accordingly. For instance, the breakdown voltage may be increased and/or the on-resistance may be reduced, but no limited thereto.

In some embodiments, the power metal-oxide-semiconductor structure 101 may include a plurality of the power metal-oxide-semiconductor units described above and sharing the same drain doped region 52. For example, the power metal-oxide-semiconductor structure 101 may include a first gate electrode (such as the gate electrode GE1 described above), a second gate electrode (such as a gate electrode GE2), a first electrically conductive pattern (such as the electrically conductive pattern CP1 described above), a second electrically conductive pattern (such as an electrically conductive pattern CP2), a first field plate (such as the field plate FP1 described above), a second field plate (such as a field plate FP2), a first source doped region (such as the source doped region 54-1 described above), a second source doped region (such as a source doped region 54-2), and a well region 16-2. The electrically conductive pattern CP2 is disposed between the field plate FP2 and the semiconductor substrate 10 in the vertical direction D1, and the field plate FP2 and the electrically conductive pattern CP2 are located between the gate electrode GE2 and the drain doped region 52 in the horizontal direction D2. The drift region 14 may be further disposed under the field plate FP2, the electrically conductive pattern CP2, and the gate electrode GE2 partially. The well region 16-1 and the well region 16-2 may be located at two opposite sides of the drift region 14 in the horizontal direction D2, respectively, and the source doped region 54-2 may be disposed in the well region 16-2. In some embodiment, a transistor unit including the field plate FP1, the electrically conductive pattern CP1, and the gate electrode GE1 and a transistor unit including the field plate FP2, the electrically conductive pattern CP2, and the gate electrode GE2 may be disposed with mirror symmetry substantially symmetrical to a center axis (not illustrated) penetrating through the drain doped region 52 as the axis of symmetry. Therefore, another dielectric structure 28A may be disposed between the field plate FP2 and the electrically conductive pattern CP2, another dielectric structure 46A may be disposed on sidewalls of the mask pattern 32A, the field plate FP2, the dielectric structure 28A, and the electrically conductive pattern CP2, and this dielectric structure 46A may be partly disposed between the field plate FP2 and the gate electrode GE2 and partly disposed between the electrically conductive pattern CP2 and the gate electrode GE2. Another mask pattern 32A may be disposed on the field plate FP2, a portion of the dielectric layer 18 may be sandwiched between the electrically conductive pattern CP2 and the semiconductor substrate 10 in the vertical direction D1, and another portion of the dielectric layer 18 may be sandwiched between the gate electrode GE2 and the semiconductor substrate 10 in the vertical direction D1.

In some embodiments, the electrically conductive pattern CP1 and the electrically conductive pattern CP2 may be two different and separated portions of an electrically conductive layer (such as an electrically conductive layer 20), and the material composition of the electrically conductive pattern CP1 may be identical to that of the electrically conductive pattern CP2 accordingly; the field plate FP1 and the field plate FP2 may be two different and separated portions of an electrically conductive layer (such as an electrically conductive layer 30), and the material composition of the field plate FP1 may be identical to that of the field plate FP2 accordingly; and the gate electrode GE1 and the gate electrode GE2 may be two different and separated portions of an electrically conductive layer (such as a patterned electrically conductive layer 50), and the material composition of the gate electrode GE1 may be identical to that of the gate electrode GE2 accordingly, but not limited thereto. In addition, the material composition and/or the doping condition of the well region 16-2 and the source doped region 54-2 may be identical to the material composition and/or the doping condition of the well region 16-1 and the source doped region 54-1 described above, respectively, but not limited thereto.

In some embodiments, the power metal-oxide-semiconductor structure 101 may further include a dielectric layer 58A and a plurality of contact structures (such as a contact structure CT1, a contact structure CT2, a contact structure CT3, and a contact structure CT4) disposed on the semiconductor substrate 10. The dielectric layer 58A may cover the drain doped region 52, the source doped region 54-1, the source doped region 54-2, the gate electrode GE1, the gate electrode GE2, the mask pattern 32A on the field plate FP1, and the mask pattern 32A on the field plate FP2. The contact structure CT1 may penetrate through the dielectric layer 58A and contact the corresponding gate electrode (such as the gate electrode GE1 or the gate electrode GE2) for being electrically connected with the corresponding gate electrode. The contact structure CT2 may penetrate through the dielectric layer 58A and the mask pattern 32A and contact the corresponding field plate (such as the field plate FP1 or the field plate FP2) for being electrically connected with the corresponding field plate. The contact structure CT3 may penetrate through the dielectric layer 58A and the dielectric layer 18 and contact the corresponding source doped region (such as the source doped region 54-1 or the source doped region 54-2) for being electrically connected with the corresponding source doped region. The contact structure CT4 may penetrate through the dielectric layer 58A and contact the drain doped region 52 for being electrically connected with the drain doped region 52. The dielectric layer 58A may include a single layer or multiple layers of dielectric materials, such as silicon oxide, silicon nitride, silicon oxynitride, or other suitable dielectric materials, and each of the contact structures may include a barrier layer and a low electrical resistivity material disposed on the barrier layer, but not limited thereto. The barrier layer described above may include titanium nitride, tantalum nitride, or other suitable barrier materials, and the low electrical resistivity material may include materials with relatively low electrical resistivity, such as copper, aluminum, tungsten, and so forth, but not limited thereto.

Figure 2:
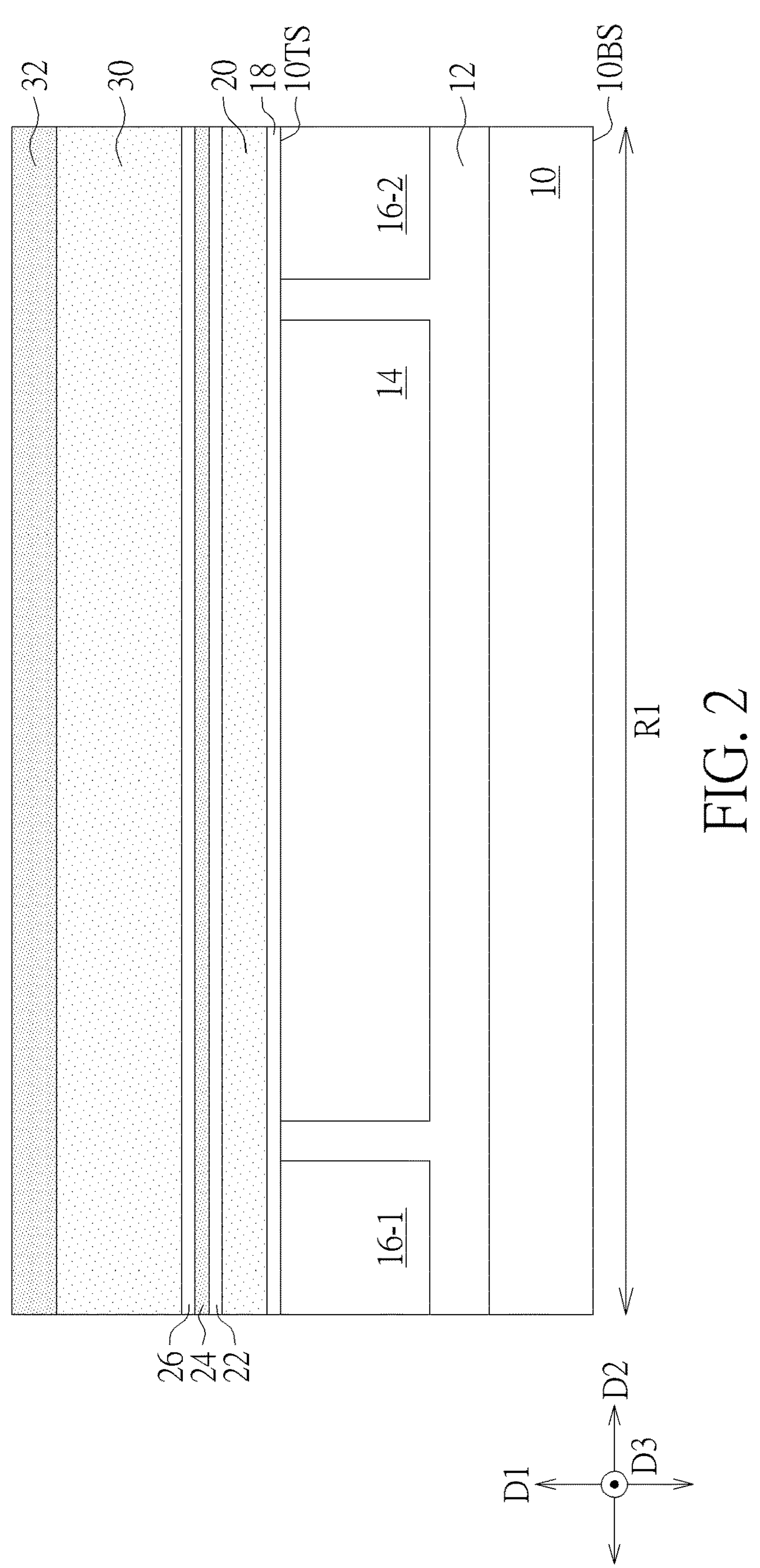
Figure 3:
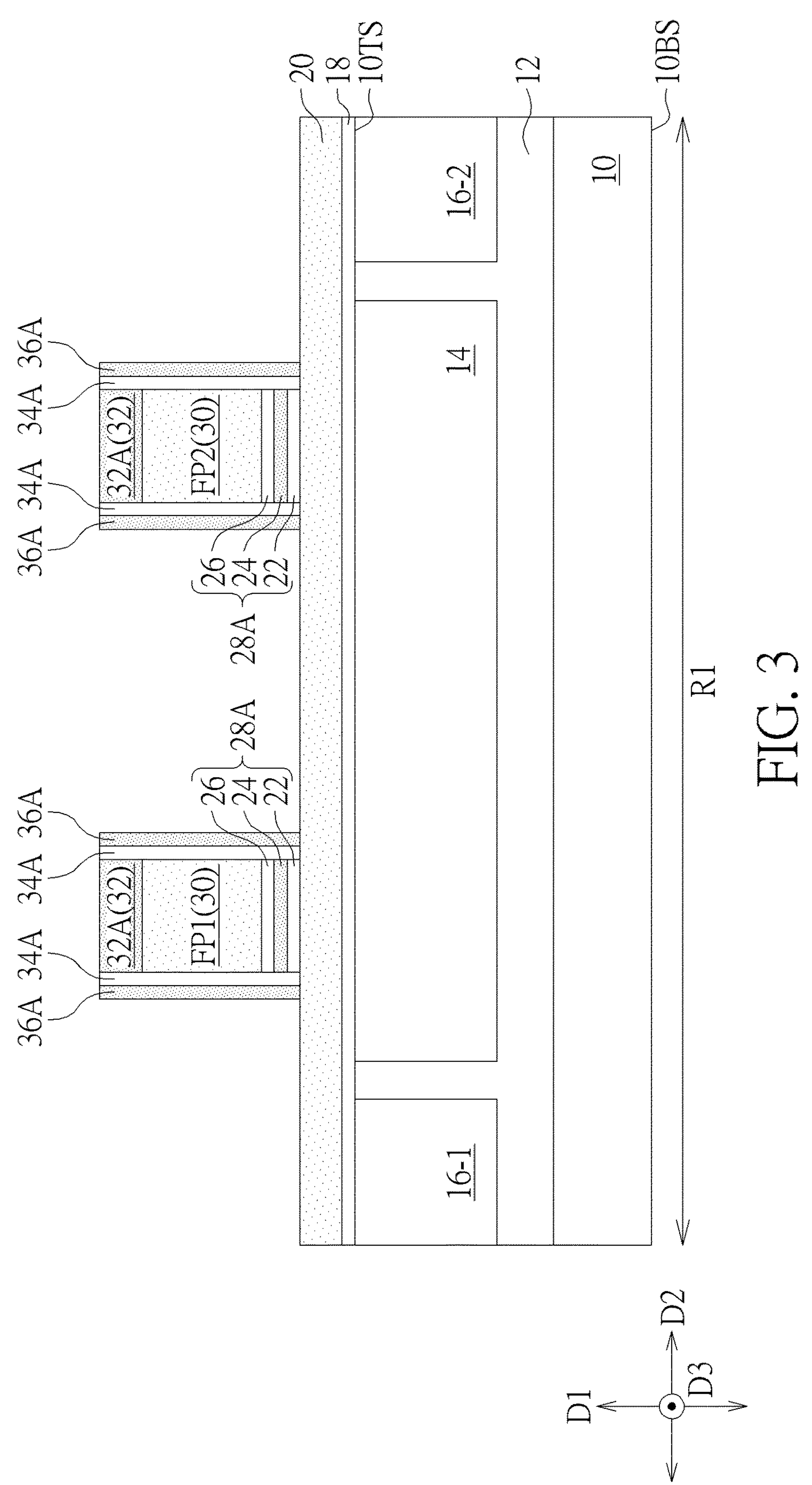
Figure 4:
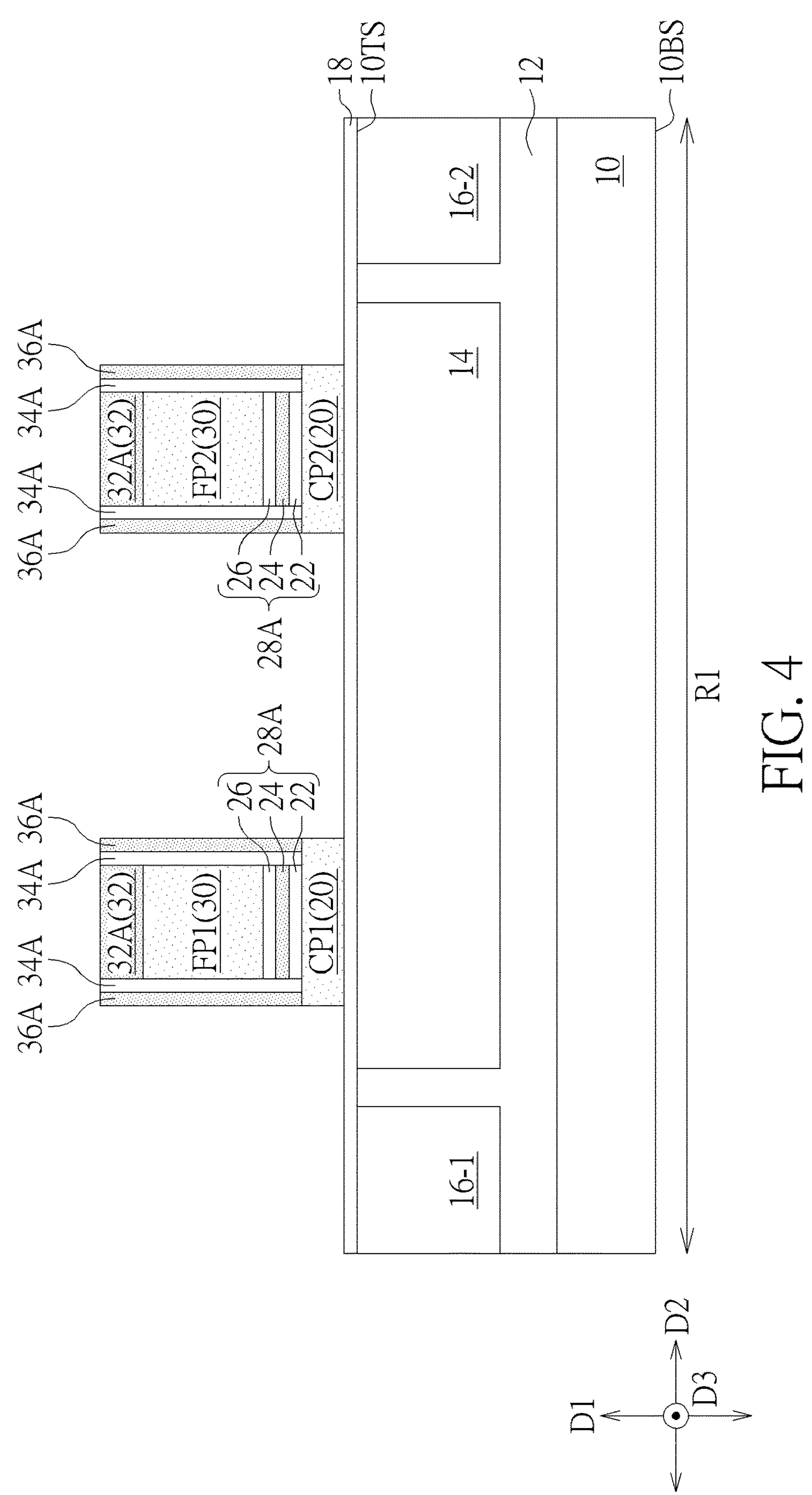
Figure 5:
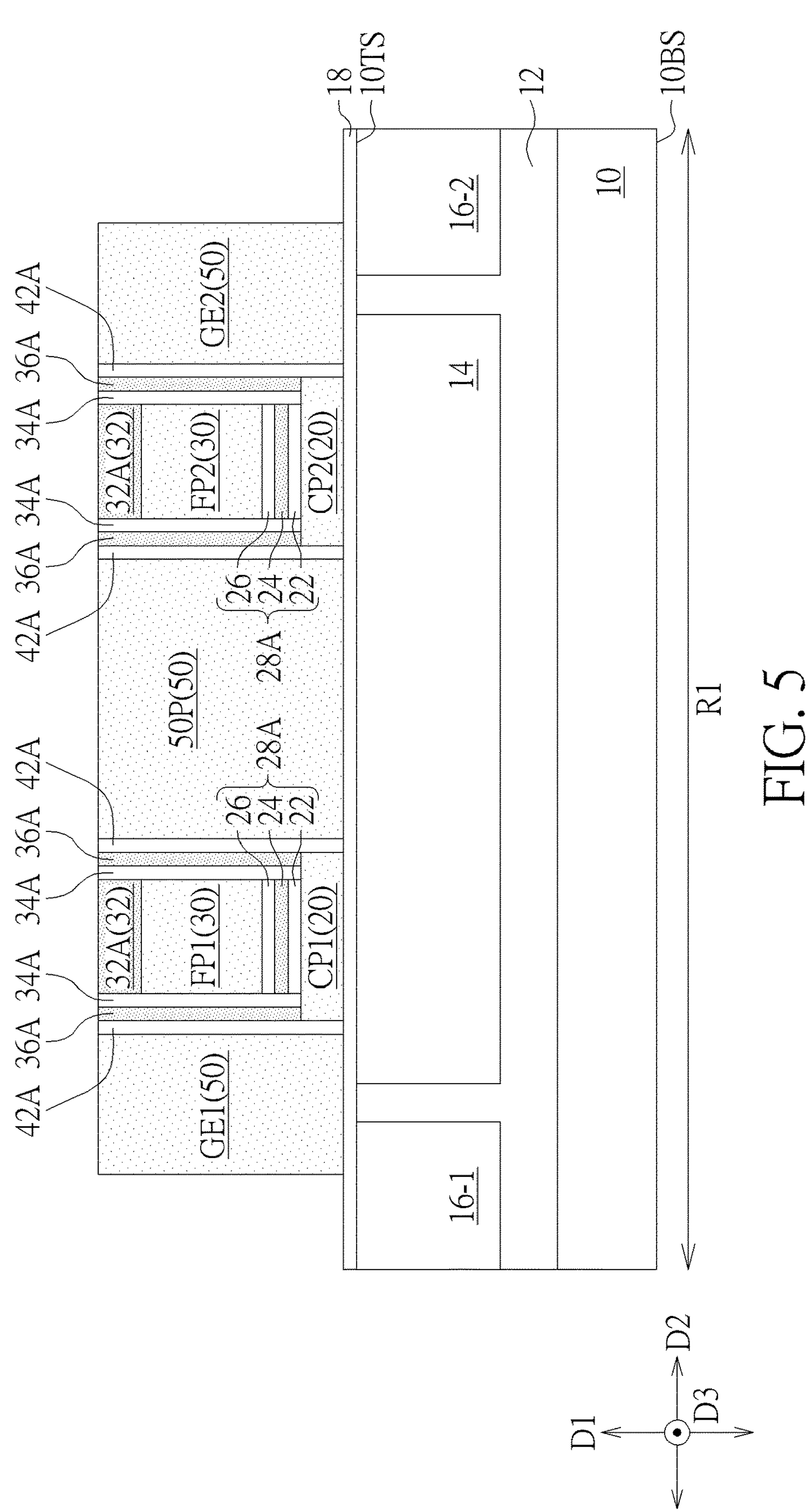

Please refer to FIGS. 1-5. FIGS. 2-5 are schematic drawings illustrating a manufacturing method of a power metal-oxide-semiconductor structure according to an embodiment of the present invention, wherein FIG. 3 is a schematic drawing in a step subsequent to FIG. 2, FIG. 4 is a schematic drawing in a step subsequent to FIG. 3, and FIG. 5 is a schematic drawing in a step subsequent to FIG. 4. In some embodiments, FIG. 1 may be regarded as a schematic drawing in a step subsequent to FIG. 5, but not limited thereto. As shown in FIG. 1, the manufacturing method in this embodiment may include the following steps. A first electrically conductive pattern (such as the electrically conductive pattern CP1) and a first field plate (such as the field plate FP1) are formed above a first region R1 of the semiconductor substrate 10, and the electrically conductive pattern CP1 is located between the field plate FP1 and the semiconductor substrate 10 in the vertical direction D1. Subsequently, a first gate electrode (such as the gate electrode GE1) is formed above the first region R1 of the semiconductor substrate 10. The field plate FP1 and the electrically conductive pattern CP1 are located at the same side of the gate electrode GE1 in the horizontal direction D2.

Specifically, the manufacturing method in this embodiment may include but is not limited to the following steps. As shown in FIG. 2, the well region 12, the drift region 14, the well region 16-1 and the well region 16-2 described above may be formed in a first region R1 of the semiconductor substrate 10. Subsequently, the dielectric layer 18, the electrically conductive layer 20, the dielectric layer 22, the dielectric layer 24, the dielectric layer 26, the electrically conductive layer 30, and a mask layer 32 may be formed sequentially on the top surface 10TS of the semiconductor substrate 10. The electrically conductive layer 20 and the electrically conductive layer 30 may respectively include a non-metallic electrically conductive material (such as doped polysilicon) or other suitable electrically conductive materials. As shown in FIG. 2 and FIG. 3, a patterning process may then be performed to the mask layer 32, the electrically conductive layer 30, the dielectric layer 26, the dielectric layer 24, and the dielectric layer 22 for forming the mask pattern 32A, the field plate FP1, the field plate FP2, and the dielectric structure 28A described above. In other words, at least a portion of the mask layer 32 may be patterned to be two mask patterns 32A separated from each other by the patterning process, at least a portion of the electrically conductive layer 30 may be patterned to be the field plate FP1 and the field plate FP2 separated from each other by the patterning process, and at least a portion of the dielectric layer 26, at least a portion of the dielectric layer 24, and at least a portion of the dielectric layer 22 may be patterned to be two dielectric structures 28A separated from each other by the patterning process. Subsequently, the spacer 34A and the spacer 36A may be formed on the sidewall of the mask pattern 32A, the sidewall of the filed plate FP1, the sidewall of the field plate FP2, and the sidewall of the dielectric structure 28A. As shown in FIG. 3 and FIG. 4, after the step of forming the spacer 34A and the spacer 36A, another patterning process may be performed to the electrically conductive layer 20 for forming the electrically conductive pattern CP1 and the electrically conductive pattern CP2. In other words, at least a portion of the electrically conductive layer 20 may be patterned to be the electrically conductive pattern CP1 and the electrically conductive pattern CP2 separated from each other by the another patterning process. Additionally, the patterning process in this description may include a photolithographic process or other suitable manufacturing approaches. By the manufacturing method described above, the dielectric layer 18, the electrically conductive pattern CP1, the electrically conductive pattern CP2, the dielectric structure 28A, the field plate FP1, the field plate FP2, the mask pattern 32A, the spacer 34A, and the spacer 36A may be formed on the first region R1 of the semiconductor substrate 10. The drift region 14, the well region 16-1, and the well region 16-2 may be formed in the first region R1 of the semiconductor substrate 10 before the steps of forming the field pate FP1, the field plate FP2, the electrically conductive pattern CP1, and the electrically conductive pattern CP2. The field pate FP1 and the field plate FP2 may be formed before the step of forming the electrically conductive pattern CP1 and the electrically conductive pattern CP2.

As shown in FIG. 4 and FIG. 5, after the step of forming the electrically conductive pattern CP1 and the electrically conductive pattern CP2, the spacer 42A, the gate electrode GE1, and the gate electrode GE2 may be formed. The spacer 42A may be formed on the spacer 36A, the sidewall of the electrically conductive pattern CP1, and the sidewall of the electrically conductive pattern CP2. The gate electrode GE1 and the gate electrode GE2 may be formed above the first region R1 of the semiconductor substrate 10. The field plate FP1, the field plate FP2, the electrically conductive pattern CP1, and the electrically conductive pattern CP2 may be located between the gate electrode GE1 and the gate electrode GE2 in the horizontal direction D2. In some embodiments, a method of forming the gate electrode GE1 and the gate electrode GE2 may include but is not limited to forming a patterned electrically conductive layer 50 above the semiconductor substrate 10. The gate electrode GE1 and the gate electrode GE2 may be two portions of the patterned electrically conductive layer 50 separated from each other, and the patterned electrically conductive layer 50 may further include a dummy portion 50P located between the field plate FP1 and the field plate FP2 in the horizontal direction D2 and located between the electrically conductive pattern CP1 and the electrically conductive pattern CP2 in the horizontal direction D2. The patterned electrically conductive layer 50 may include a non-metallic electrically conductive material (such as doped polysilicon) or other suitable electrically conductive materials. In some embodiments, a portion of the spacer 42A, a portion of the spacer 36A, and a portion of the spacer 34A may be located between the dummy portion 50P and the mask pattern 32A, between the dummy portion 50P and the field plate FP1, between the dummy portion 50P and the field plate FP2, and between the dummy portion 50P and the dielectric structure 28A in the horizontal direction D2. A portion of the spacer 42A may be located between the dummy portion 50P and the electrically conductive pattern CP1 and d between the dummy portion 50P and the electrically conductive pattern CP2 in the horizontal direction D2.

As shown in FIG. 5 and FIG. 1, a removing process may be carried out for removing the dummy portion 50P and exposing a part of the semiconductor substrate 10 and/or a part of the drift region 14. After the step of removing the dummy portion 50P of the patterned electrically conductive layer 50, the drain doped region 52, the source doped region 54-1, and the source doped region 54-2 may be formed in the semiconductor substrate 10. In some embodiments, the drain doped region 52 may be formed in the drift region 14, and the source doped region 54-1 and the source doped region 54-2 may be formed in the well region 16-1 and the well region 16-2, respectively. Additionally, the drain doped region 52 may be located between the electrically conductive pattern CP1 and the electrically conductive pattern CP2 in the horizontal direction D2. The source doped region 54-1 and the drain doped region 52 may be located at two opposite sides of the gate electrode GE1 in the horizontal direction D2, respectively. The source doped region 54-2 and the drain doped region 52 may be located at two opposite sides of the gate electrode GE2 in the horizontal direction D2, respectively. In addition, at least a part of the electrically conductive pattern CP1, at least a part of the electrically conductive pattern CP2, at least a part of the field pate FP1, and at least a part of the field plate FP2 may be located above the drift region 14 in the vertical direction D1, but not limited thereto. IN some embodiments, after the steps of forming the drain doped region 52, the source doped region 54-1, and the source doped region 54-2, the dielectric layer 58A and the contact structures described above may be formed for forming the power metal-oxide-semiconductor structure 101 illustrated in FIG. 1.

Figure 6:
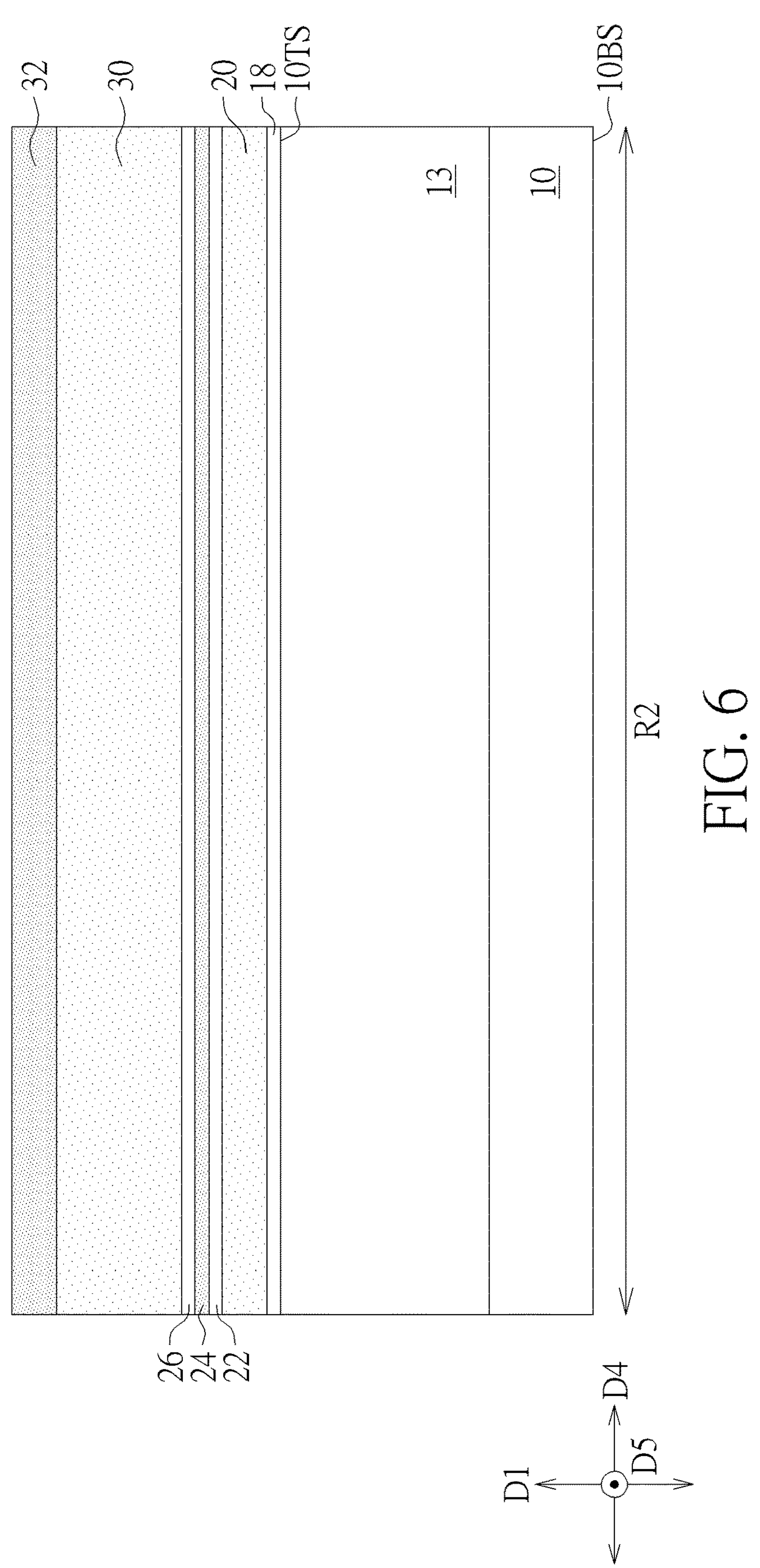
Figure 7:
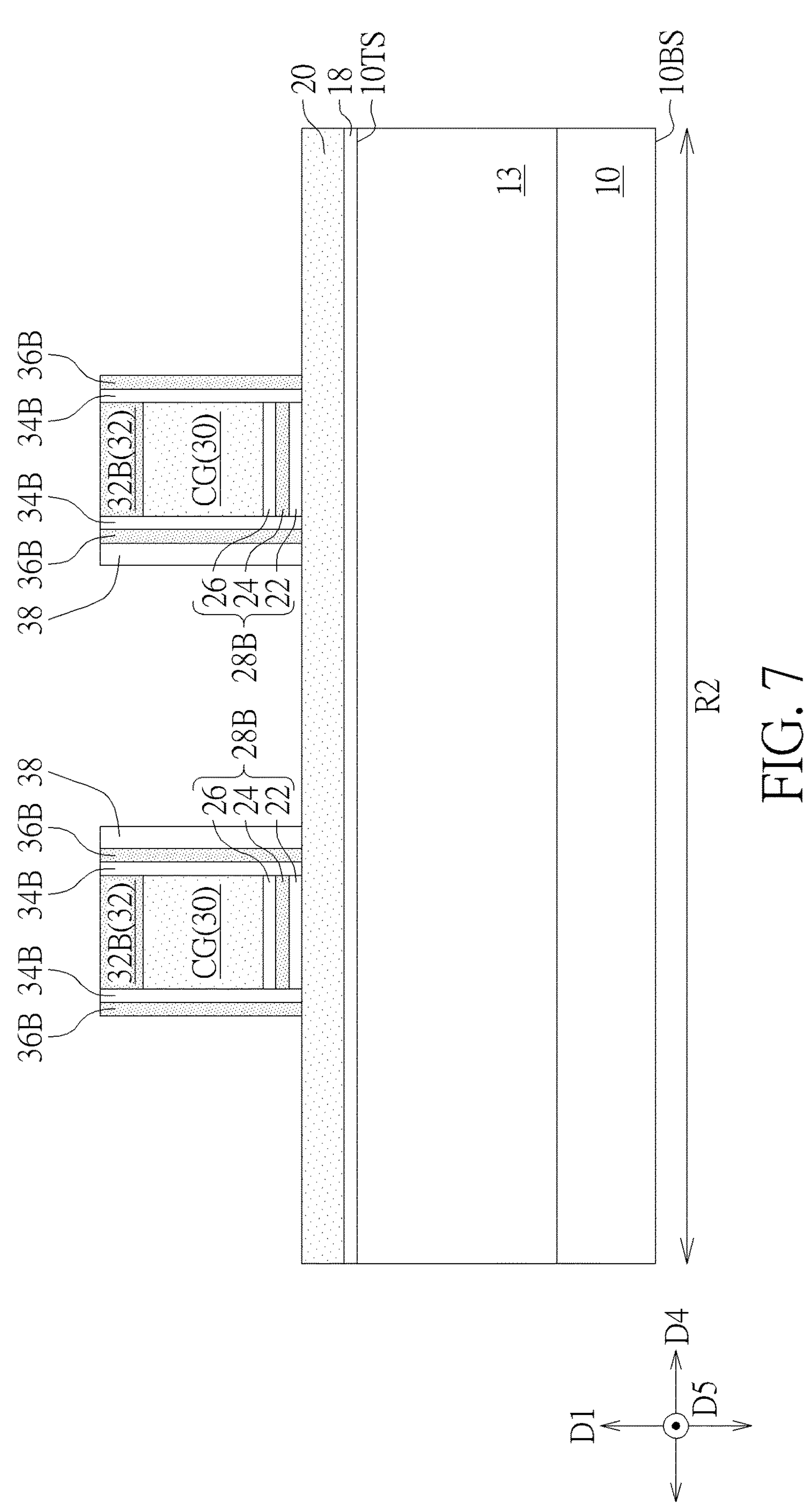
Figure 8:
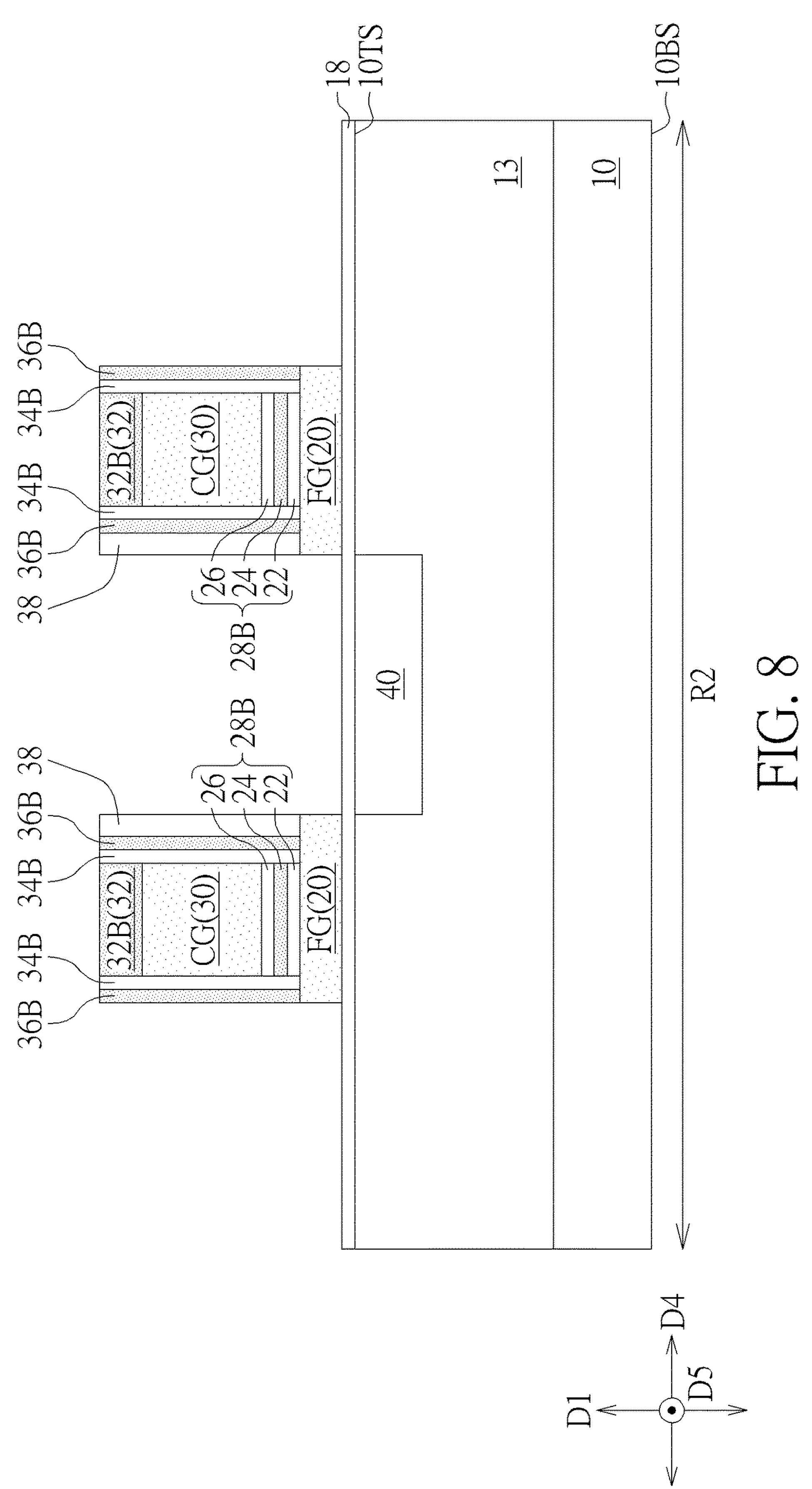
Figure 9:
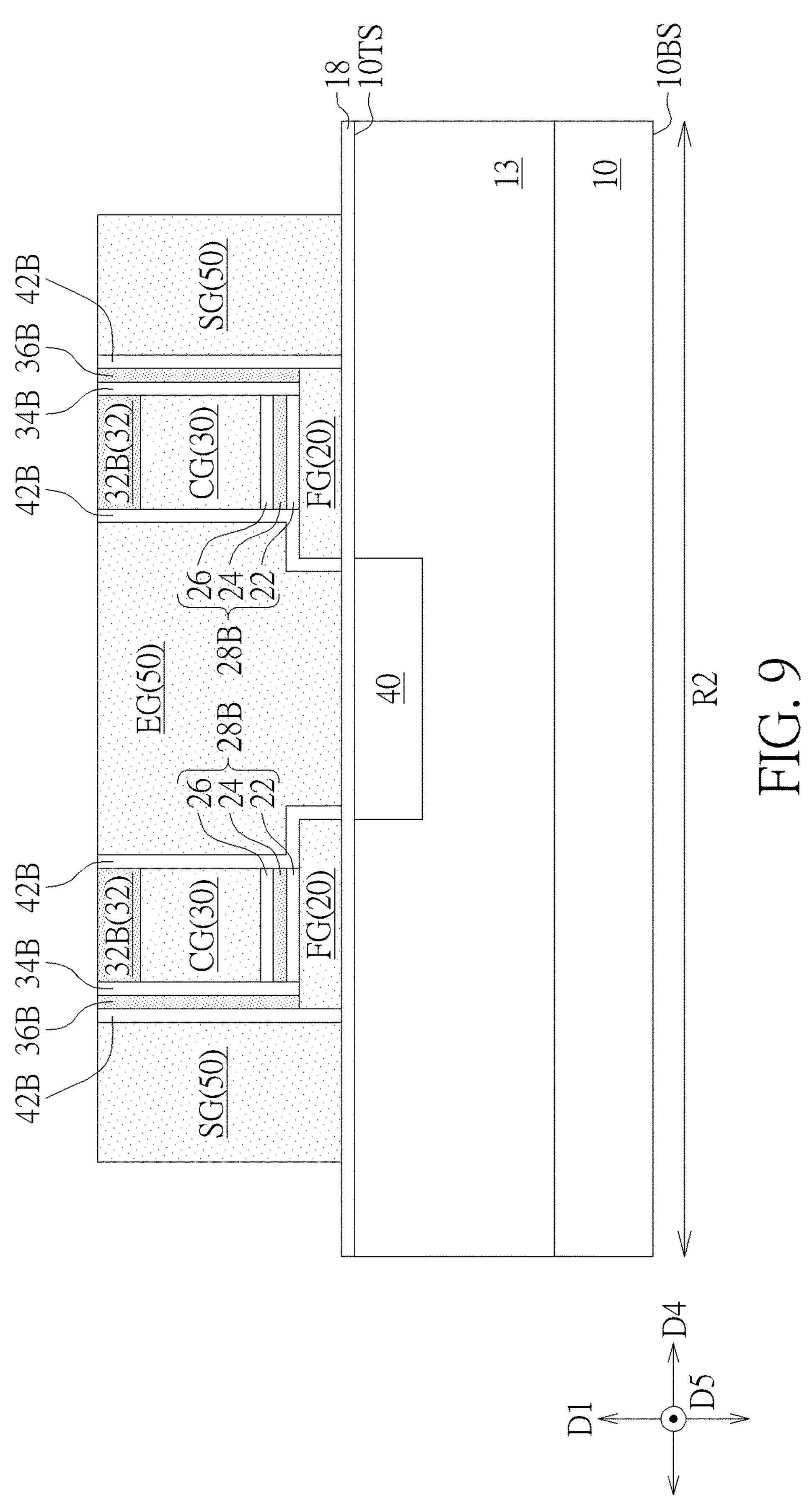
Figure 10:
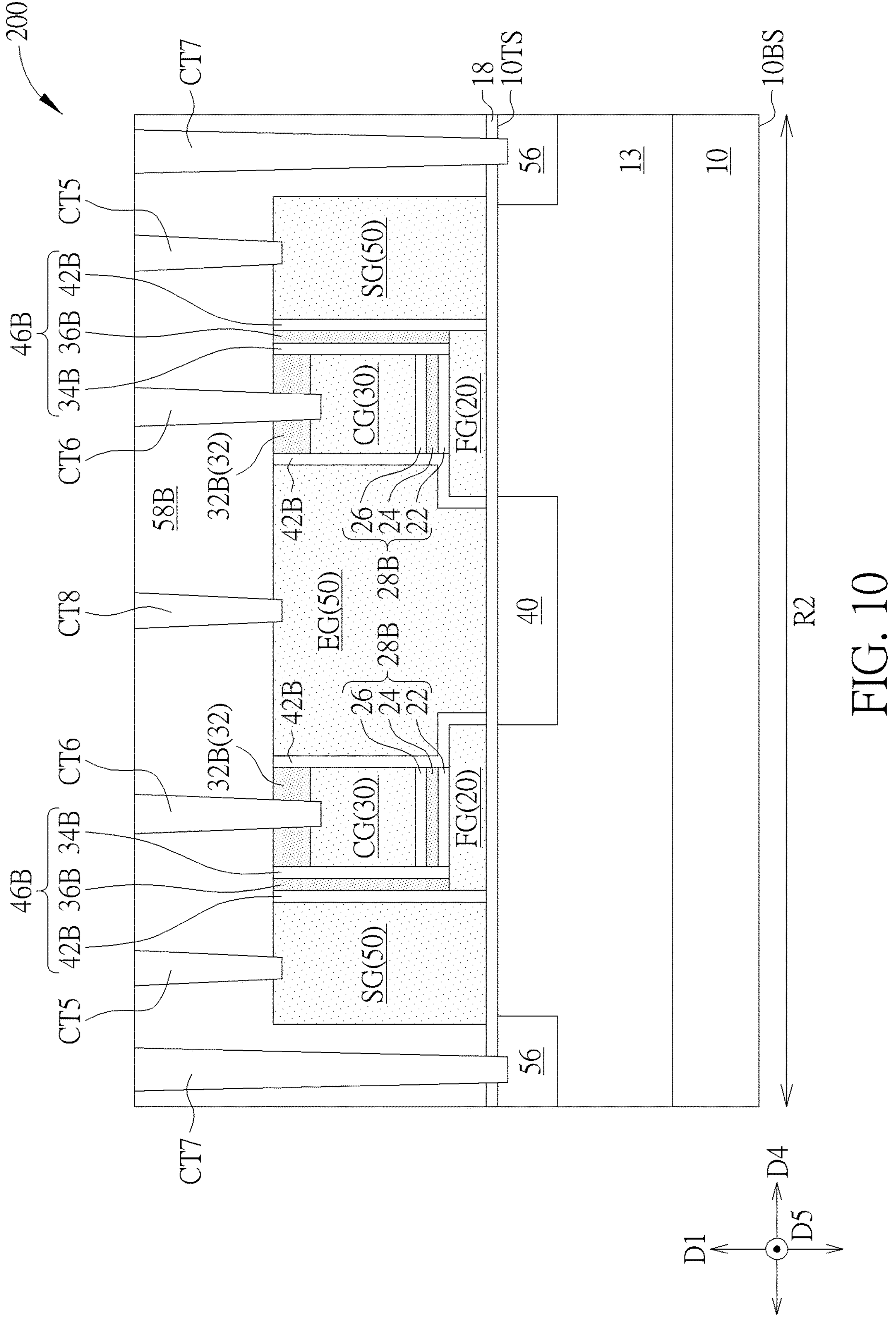

Please refer to FIGS. 1-10. FIGS. 6-10 are schematic drawings illustrating a manufacturing method of a memory structure 200 according to an embodiment of the present invention, wherein FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, and FIG. 10 is a schematic drawing in a step subsequent to FIG. 9. As shown in FIG. 10, in some embodiments, the memory structure 200 may be formed on another region (such as a second region R2) of the semiconductor substrate 10, and the memory structure 200 may include a well region 13, a doped region 40, a doped region 56, the dielectric layer 18, a floating gate FG, a dielectric structure 28B, a control gate CG, a mask pattern 32B, a spacer 42B, a dielectric structure 46B, a select gate SG, and an erase gate EG. The well region 13 is disposed in the semiconductor substrate 10, and the doped region 40 and the doped region 56 are disposed in the well region 13. The floating gate FG is located between the control gate CF and the semiconductor substrate 10 in the vertical direction D1, and the dielectric structure 28B is located between the control gate CG and the floating gate FG in the vertical direction D1. In some embodiments, the dielectric structure 28B may include the dielectric layer 22, the dielectric layer 24, and the dielectric layer 26 described above, but not limited thereto. The select gate SG is disposed on the semiconductor substrate 10, the mask pattern 32B is disposed on the control gate CG, the floating gate FG may be located between the doped region 40 and the select gate SG in a horizontal direction D4, and the select gate SG may be located between the dope region 56 and the floating gate FG in the horizontal direction D4. The dielectric structure 46B may be located between the select gate SG and the mask pattern 32B, between the select gate SG and the control gate, and between the select gate SG and the dielectric structure 28B in the horizontal direction D4, and a portion of the dielectric structure 46B (such as the spacer 42B) may be located between the select gate SG and the floating gate FG in the horizontal direction D4. In some embodiments, the dielectric structure 46B may include a spacer 34B, a spacer 36B, and a portion of the spacer 42B sequentially disposed and stacked from an end adjacent to the control gate CG towards an end adjacent to the select gate SG in the horizontal direction D4, and the material compositions of the spacer 34B, the spacer 36B, and the spacer 42B may be identical to those of the spacer 34A, the spacer 36A, and the spacer 42A in the dielectric structure 46A shown in FIG. 1, but not limited thereto. In addition, the erase gate EG may be disposed above the doped region 40, another portion of the spacer 42B may be located between the erase gate EG and the mask pattern 32B, between the erase gate EG and the control gate CG, between the erase gate EG and the dielectric structure 28B, and between the erase gate EG and the floating gate FG in the horizontal direction D4, and a portion of the spacer 42B may be sandwiched between the erase gate EG and the floating gate FG in the vertical direction D1. In some embodiments, the material composition of the spacer 42B may be identical to that of the spacer 42A shown in FIG. 1, but not limited thereto.

In some embodiments, the doped region 40 and the doped region may be a source line doped region and a bit line doped region, respectively. The doped region 40, the doped region 56, the dielectric layer 18, the floating gate FG, the control gate CG, the select gate SG, the erase gate EG, the dielectric structure 28B, the dielectric structure 46B, and the spacer 42B may constitute at least a portion of a memory unit, and the memory unit may include a flash memory unit (such as an embedded flash memory), but not limited thereto. Additionally, in some embodiments, the memory structure 200 may include two memory units described above sharing one erase gate EG and one doped region 40, and the two memory unit may be disposed with mirror symmetry substantially symmetrical to a center axis (not illustrated) penetrating through the erase gate EG and the doped region 40 as the axis of symmetry, but not limited thereto. In some embodiments, the memory structure 200 may further include a dielectric layer 58B and a plurality of contact structures (such as a contact structure CT5, a contact structure CT6, a contact structure CT7, and a contact structure CT8) disposed on the second region R2 of the semiconductor substrate 10. The dielectric layer 58B may cover the doped region 56, the select gate SG, the mask pattern 32B on the control gate CG, and the erase gate EG. The contact structure CT5 may penetrate through the dielectric layer 58B and contact the corresponding select electrode SG for being electrically connected with the select gate SG. The contact structure CT6 may penetrate through the dielectric layer 58B and the mask pattern 32B and contact the corresponding control gate CG for being electrically connected with the control gate CG. The contact structure CT7 may penetrate through the dielectric layer 58B and the dielectric layer 18 and contact the corresponding doped region 56 for being electrically connected with the doped region 56. The contact structure CT8 may penetrate through the dielectric layer 58B and contact the erase gate EG for being electrically connected with the erase gate EG, and another contact structure (not illustrated) may be electrically connected with the doped region 40. The dielectric layer 58B may include a single layer or multiple layers of dielectric materials, such as silicon oxide, silicon nitride, silicon oxynitride, or other suitable dielectric materials, and the material composition of the dielectric layer 58B may be identical to or similar to that of the dielectric layer 58A illustrated in FIG. 1, but not limited thereto. In addition, the material composition of each of the contact structures in the memory structure 200 may be identical to or similar to that of each of the contact structures illustrated in FIG. 1, but not limited thereto.

As shown in FIG. 1 and FIG. 10, the power metal-oxide-semiconductor structure 101 and the memory structure 200 may be formed on the first region R1 and the second region R2 of the semiconductor substrate 10, respectively, and the first region R1 and the second region R2 may be regarded as a power semiconductor unit region and a memory unit region, respectively, but not limited thereto. In some embodiments, the gate electrode the field plate and the electrically conductive pattern in the power metal-oxide-semiconductor structure 101 may be elongated respectively in the horizontal direction D3 substantially orthogonal to the horizontal direction D2, and the select gate SG, the control gate CG, and the floating gate FG in the memory structure 200 may be elongated respectively in a horizontal direction D5 substantially orthogonal to the horizontal direction D4, but not limited thereto. In addition, the horizontal directions described above may be substantially orthogonal to the vertical direction D1, and the horizontal direction D2 may be parallel with the horizontal direction D4 or not according to some design considerations. Additionally, n some embodiments, the manufacturing method of the power metal-oxide-semiconductor structure 101 may be integrated with the manufacturing method of the memory structure 200 for simplifying the entire manufacturing process and/or reducing the manufacturing cost, but the present invention is not limited to this. In some embodiments, the power metal-oxide-semiconductor structure 101 and the memory structure 200 may also be formed on the semiconductor substrate 10 respectively by different manufacturing methods.

As shown in FIG. 2 and FIG. 6, in some embodiments, the dielectric layer 18, the electrically conductive layer 20, the dielectric layer 22, the dielectric layer 24, the dielectric layer 26, the electrically conductive layer 30, and the mask layer 32 may be formed above the first region R1 and the second region R2 of the semiconductor substrate 10, and the well region 13 described above may be formed in the second region R2 of the semiconductor substrate 10. Subsequently, as shown in FIGS. 2-3 and FIGS. 6-7, the patterning process may be performed to the mask layer 32, the electrically conductive layer 30, the dielectric layer 26, the dielectric layer 24, and the dielectric layer 22 above the first region R1 and the second region R2 for forming the mask patterns 32A, the field plate FP1, the field plate FP2, and the dielectric structures 28A on the first region R1 and forming the mask patterns 32B, the control gates CG, and the dielectric structures 28B on the second region R2. Therefore, the material composition of the dielectric structure 28A may be identical to that of the dielectric structure 28B, the material composition of the control gate CG may be identical to that of the field plate FP1 and the field plate FP2, and the material composition of the mask pattern 32A may be identical to that of the mask pattern 32B. In other words, the control gate and the field plate (such as the field plate FP1 or the field plate FP2) may be two different and separated portions of an electrically conductive layer (such as the electrically conductive layer 30 after being patterned) formed above the semiconductor substrate 10, and the control gates CG, the field plate FP1, and the field plate FP2 may be formed concurrently by the same manufacturing process, but not limited thereto. Subsequently, the spacer 34A and the space 36A may be formed on the first region R1, and the spacer 34B, the spacer 36B, and a spacer 38 may be formed on the second region R2. In some embodiments, the spacer 38 may be formed on the sidewall of the spacer 36B and located between the two control gates CG in the horizontal direction D4. The spacer 38 may include an oxide dielectric material or other suitable dielectric materials, and the spacer 38 may be used as a portion of a mask for defining the floating gate in the subsequent process, but not limited thereto.

As shown in FIGS. 3-4 and FIGS. 7-8, the another patterning process may be performed to the electrically conductive layer 20 for forming the electrically conductive pattern CP1 and the electrically conductive pattern CP2 above the first region R1 and forming the floating gates FG above the second region R2. In other words, the floating gate FG and the electrically conductive pattern (such as the electrically conductive pattern CP1 or the electrically conductive pattern CP2) may be two different and separated portions of an electrically conductive layer (such as the electrically conductive layer 20 after being patterned) formed above the semiconductor substrate 10, and the floating gate FG, the electrically conductive pattern CP1, and the electrically conductive pattern CP2 may be formed concurrently by the same manufacturing process, but not limited thereto. In addition, after the step of forming the floating gate FG, the doped region 40 may be formed in the second region R2 of the semiconductor substrate 10, and the drift region 14, the well region 16-1, and the well region 16-2 in the first region R1 may be formed before the step of forming the doped region 40 accordingly, but not limited thereto. Subsequently, as shown in FIGS. 4-5 and FIGS. 8-9, the patterned electrically conductive layer 50 may be formed above the first region R1 and the second region R2 of the semiconductor substrate 10. The ease gate EG and the two select gates SG may be separated portions of the patterned electrically conductive layer 50 formed above the second region R2. Therefore, the select gate SG, the erase gate EG, the gate electrode GE1, the gate electrode GE2, and the dummy portion 50P may be different and separated portions of an electrically conductive layer (such as the patterned electrically conductive layer 50) formed above the semiconductor substrate 10, and the select gate SG, the erase gate EG, the gate electrode GE1, the gate electrode GE2, and the dummy portion 50P may be formed concurrently by the same manufacturing process, but not limited thereto. In addition, the spacer 42B may be formed above the second region R2 before the step of forming the patterned electrically conductive layer 50, and the spacer 34B, the spacer 36B, and the spacer 38 located between the two control gates CG may be removed before the step of forming the spacer 42B. In some embodiments, the spacer 42A and the spacer 42B may be formed concurrently by the same manufacturing process, but not limited thereto.

In the manufacturing method described above, the control gate CG located above the second region R2 and the field plate FP1 and the field plate FP2 located above the first region R1 may be formed concurrently by the same manufacturing process, no additional process is required to form the field plate in the power metal-oxide-semiconductor structure, and the purposes of process simplification and manufacturing cost reduction may be achieved accordingly. In addition, the dimension of the field plate may be influenced by the design specification of the control gate and may be reduced relatively because the electrically conductive pattern and the dielectric structure are disposed between the field plate and the semiconductor substrate 10 and the field plate and the control gate CG may be formed concurrently by the same manufacturing process, and the area occupied by the power metal-oxide-semiconductor structure 101 on the semiconductor substrate 10 may be reduced accordingly, but not limited thereto.

The following description will detail the different embodiments of the present invention. To simplify the description, the following description will detail the dissimilarities among different embodiments and the identical features will not be redundantly described. In addition, for making it easier to compare the embodiments, identical components in each of the following embodiments are marked with identical symbols.

Figure 11:
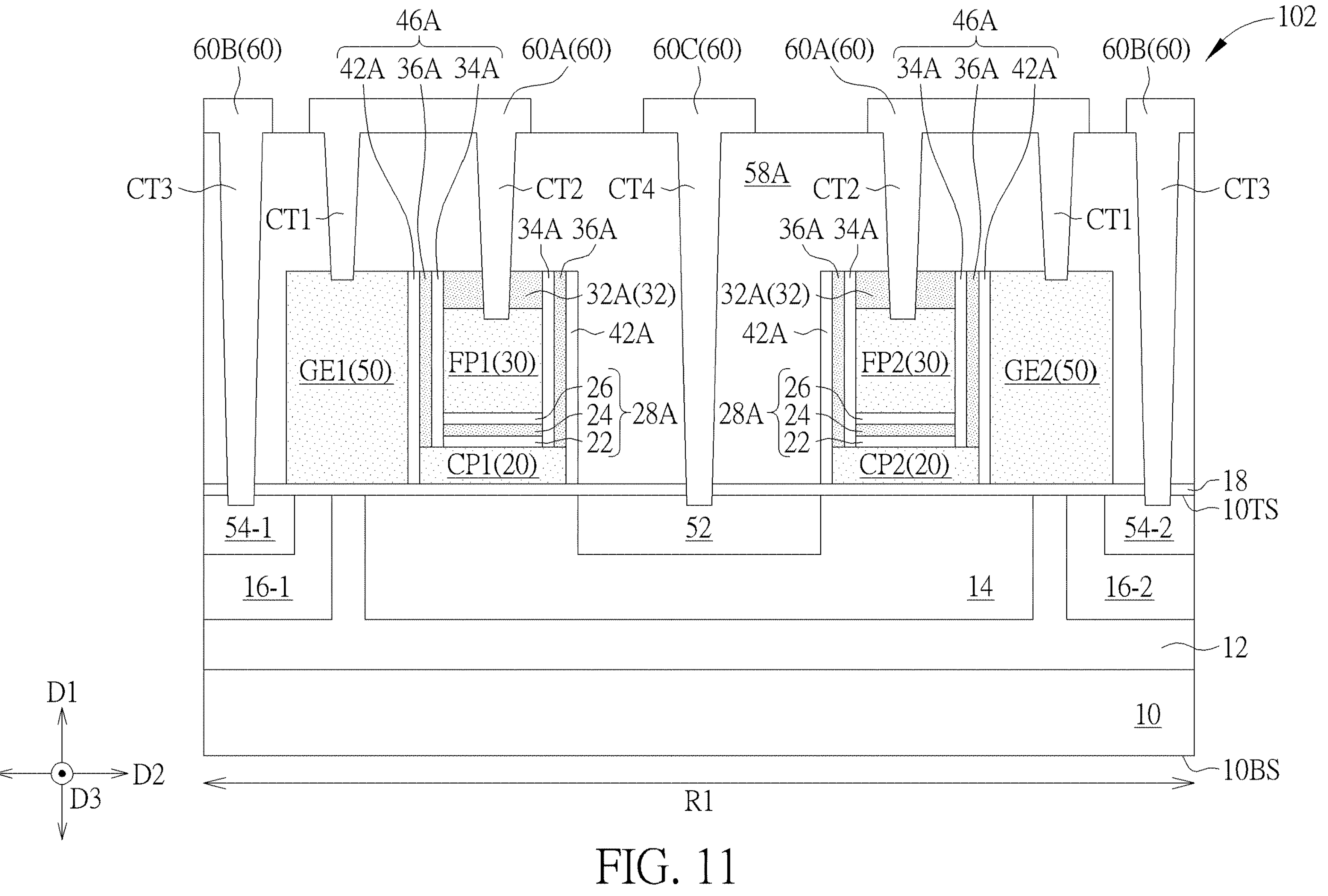
FIG. 11 is a schematic drawing illustrating a power metal-oxide-semiconductor structure according to a second embodiment of the present invention.

Please refer to FIG. 11. FIG. 11 is a schematic drawing illustrating a power metal-oxide-semiconductor structure 102 according to a second embodiment of the present invention. As shown in FIG. 11, the power metal-oxide-semiconductor structure 102 may further include an electrically conductive layer 60, and a material composition of the electrically conductive layer 60 may be identical to or similar to that of the contact structures. The electrically conductive layer 60 may include a plurality of portions separated from one another, such as a portion 60A connected with the contact structure CT1 and the contact structure CT2, a portion 60B connected with the contact structure CT3, and a portion 60C connected with the contact structure CT4, but not limited thereto. Therefore, the field plate FP1 may be electrically connected with the gate electrode GE1 via the contact structure CT1, the contact structure CT2, and the portion 60A of the electrically conductive layer 60, and the field plate FP2 may be electrically connected with the gate electrode GE2 via the contact structure CT1, the contact structure CT2, and the portion 60A of the electrically conductive layer 60. Therefore, during the operation, the electric potential of the field plate FP1 may be equal to the electric potential of the gate electrode GE1, and the electric potential of the field plate FP2 may be equal to the electric potential of the gate electrode GE2 for satisfying the operation requirements. Relatively, for the power metal-oxide-semiconductor structure 101 illustrated in FIG. 1, the electric potential of the field plate may be equal to or different from the electric potential of the gate electrode during the operation according to some design considerations.

To summarize the above descriptions, according to power metal-oxide-semiconductor structure and the manufacturing method thereof in the present invention, the electrically conductive pattern and the field plate may be formed and stacked at the same side of the gate electrode for improving the electrical performance of the power metal-oxide-semiconductor structure. For example, the breakdown voltage may be increased and/or the on-resistance may be reduced accordingly, but no limited thereto. In addition, the manufacturing method of the power metal-oxide-semiconductor structure may be integrated with the manufacturing method of the memory structure for simplifying the total manufacturing processes, reducing the manufacturing cost, and/or reducing the area occupied by the power metal-oxide-semiconductor structure on the semiconductor substrate, but not limited thereto.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A power metal-oxide-semiconductor structure, comprising:
a semiconductor substrate;
a gate electrode disposed above the semiconductor substrate;
a field plate disposed above the semiconductor substrate; and
an electrically conductive pattern disposed between the field plate and the semiconductor substrate in a vertical direction, wherein the field plate and the electrically conductive pattern are located at the same side of the gate electrode in a horizontal direction, and a topmost surface of the electrically conductive pattern is lower than a topmost surface of the gate electrode in the vertical direction.

2. The power metal-oxide-semiconductor structure according to claim 1, wherein the electrically conducive pattern is an electrically floating pattern electrically separated from the field plate and the gate electrode.

3. The power metal-oxide-semiconductor structure according to claim 1, further comprising:
a drain doped region disposed in the semiconductor substrate, wherein the field plate and the electrically conductive pattern are located between the drain doped region and the gate electrode in the horizontal direction.

4. The power metal-oxide-semiconductor structure according to claim 3, further comprising:
a drift region disposed in the semiconductor substrate, wherein the drain doped region is located in the drift region, and at least a part of the electrically conductive pattern and at least a part of the field plate are located above the drift region in the vertical direction; and
a source doped region disposed in the semiconductor substrate, wherein the source doped region and the drain doped region are located at two opposite sides of the gate electrode in the horizontal direction.

5. The power metal-oxide-semiconductor structure according to claim 1, further comprising:
a first dielectric structure disposed between the field plate and the electrically conductive pattern in the vertical direction.

6. The power metal-oxide-semiconductor structure according to claim 5, wherein the first dielectric structure comprises an oxide-nitride-oxide (ONO) structure.

7. The power metal-oxide-semiconductor structure according to claim 1, further comprising:
a second dielectric structure disposed above the semiconductor substrate, wherein the second dielectric structure is partly disposed between the field pate and the gate electrode in the horizontal direction and partly disposed between the electrically conductive pattern and the gate electrode in the horizontal direction.

8. The power metal-oxide-semiconductor structure according to claim 7, wherein the second dielectric structure comprises an oxide-nitride-oxide (ONO) structure.

9. The power metal-oxide-semiconductor structure according to claim 7, wherein a part of the second dielectric structure is located above the electrically conductive pattern in the vertical direction.

10. The power metal-oxide-semiconductor structure according to claim 1, wherein the field plate is electrically connected with the gate electrode.

11. The power metal-oxide-semiconductor structure according to claim 7, wherein the second dielectric structure directly contacts the field plate and the gate electrode.

12. The power metal-oxide-semiconductor structure according to claim 7, wherein a part of the second dielectric structure is located directly above the electrically conductive pattern in the vertical direction.

13. The power metal-oxide-semiconductor structure according to claim 1, wherein a topmost surface of the field plate is lower than the topmost surface of the gate electrode in the vertical direction.

* * * * *